US009514995B1

United States Patent
Fogel et al.

(10) Patent No.: US 9,514,995 B1
(45) Date of Patent: Dec. 6, 2016

(54) IMPLANT-FREE PUNCH THROUGH DOPING LAYER FORMATION FOR BULK FINFET STRUCTURES

(71) Applicant: GLOBALFOUNDRIES INC., Grand Cayman (KY)

(72) Inventors: Keith E. Fogel, Hopewell Junction, NY (US); Alexander Reznicek, Troy, NY (US); Devendra K. Sadana, Pleasantville, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/718,760

(22) Filed: May 21, 2015

(51) Int. Cl.
*H01L 29/66* (2006.01)
*H01L 21/8238* (2006.01)
*H01L 27/092* (2006.01)
*H01L 29/10* (2006.01)

(52) U.S. Cl.
CPC ........ *H01L 21/823878* (2013.01); *H01L 21/823821* (2013.01); *H01L 27/0924* (2013.01); *H01L 29/1083* (2013.01)

(58) Field of Classification Search
CPC ........ H01L 21/823418–21/823431; H01L 21/823814–21/823821; H01L 21/845; H01L 27/0886–27/0924; H01L 27/10826; H01L 27/10879; H01L 27/1211; H01L 29/41791; H01L 29/66772; H01L 29/66795
See application file for complete search history.

(56) References Cited

U.S. PATENT DOCUMENTS

| 6,028,339 | A | 2/2000 | Frenette |
| 7,135,350 | B1 | 11/2006 | Smith |
| 2015/0044829 | A1* | 2/2015 | Kim .................. H01L 21/82380 438/199 |
| 2015/0087116 | A1 | 3/2015 | Bobde |

FOREIGN PATENT DOCUMENTS

| CN | 104112665 | 10/2014 |
| CN | 104112667 | 10/2014 |
| DE | 1803392 | 6/1970 |
| GB | 1229385 | 4/1971 |
| JP | 02058273 | 2/1990 |
| JP | 05283629 | 10/1993 |
| JP | 2008251732 A | 10/2008 |

* cited by examiner

*Primary Examiner* — Cuong B Nguyen
(74) *Attorney, Agent, or Firm* — Yuanmin Cai; Andrew M. Calderon; Roberts Mlotkowski Safran Cole & Calderon P.C.

(57) ABSTRACT

A punch through stop layer is formed in a bulk FinFET structure using doped oxides. Dopants are driven into the substrate and base portions of the fins by annealing. The punch through stop layer includes a p-type region and an n-type region, both of which may extend substantially equal distances into the semiconductor fins.

7 Claims, 14 Drawing Sheets

IMPLANT-FREE PUNCH THROUGH DOPING LAYER FORMATION FOR BULK FINFET STRUCTURES

FIELD

The present disclosure relates to the physical sciences, and, more particularly, to fin-type field effect transistor (FinFET) structures and methods of fabrication thereof.

BACKGROUND

Some types of field effect transistors (FETs) have three-dimensional, non-planar configurations including fin-like structures extending above semiconductor substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

Both nFETs and pFETs can be formed on the same substrate. Silicon channels can be employed for both types of devices. Hybrid channel FinFETs are characterized by the use of silicon channels in the nFET regions and silicon germanium channels in the pFET regions. Impurities can be introduced below the fins to provide a punch through stop (PTS). Punch through isolation of fins in a bulk FinFET device is provided to avoid leakage and is typically formed with the well implant. Ion implantation into strained semiconductors will relax them. A deeper implant is required for relatively tall fins.

SUMMARY

Principles of the present disclosure provide an exemplary fabrication method that includes obtaining a structure including a semiconductor substrate having an nFET region and a pFET region, a plurality of parallel semiconductor fins extending from the substrate, and a plurality of channels separating the semiconductor fins. A p-doped oxide layer partially fills one or more of the channels and directly contacts the nFET region of the substrate and a one or more of the semiconductor fins in the nFET region. An n-doped oxide layer partially fills one or more of the channels and directly contacts the pFET region of the substrate and one or more of the semiconductor fins in the pFET region. An essentially undoped dielectric layer fills the plurality of channels and overlies the p-doped oxide layer and the n-doped oxide layer. The method further includes annealing the structure to form a punch through stop layer, the step of annealing the structure causing p-type dopants to be driven from the p-doped oxide layer into one or more of the semiconductor fins in the nFET region and into the nFET region of the substrate and n-type dopants to be driven from the n-doped oxide layer into one or more of the semiconductor fins in the pFET region and into the pFET region of the substrate. At least part of the essentially undoped dielectric layer is removed following annealing the structure, thereby exposing side walls of the semiconductor fins.

An exemplary structure is provided that includes a semiconductor substrate having a top surface and first and second regions, a plurality of parallel semiconductor fins extending from the top surface of the semiconductor substrate, one or more of the semiconductor fins extending from the first region and one or more of the semiconductor fins extending from the second region, the semiconductor fins defining a plurality of channels. A p-type punch through stop layer is within the first region of the semiconductor substrate and the one or more semiconductor fins extending from the first region, the p-type punch through stop layer including diffused p-type dopants. An n-type punch through stop layer is within the second region of the semiconductor substrate and the one or more semiconductor fins extending from the second region, the n-type punch through stop layer including diffused n-type dopants. An undoped oxide layer partially fills the channels.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

FinFET structures and fabrication methods as disclosed herein can provide substantial beneficial technical effects. For example, one or more embodiments may provide one or more of the following advantages:

Enhanced performance obtained by using strained semiconductor materials;
Avoidance of ion implantation and resulting crystal damage through the use of doped local isolation for punch through stopping layer;
Processing techniques applicable to sub-20 nm node technology;
Different diffusion properties of dopants in hybrid structures effectively addressed.

These and other features and advantages will become apparent from the following detailed description of illustrative embodiments thereof, which is to be read in connection with the accompanying drawings.

DETAILED DESCRIPTION

FinFET structures are characterized by fins formed on semiconductor substrates. Such substrates include bulk silicon substrates (fin on bulk) and SOI substrates (fin on SOI) as discussed above. The processes discussed below are applicable to fabrication of silicon channel as well as hybrid channel FinFET structures wherein sets of fins comprising silicon and silicon germanium are desired. FIGS. 1-13 illustrate exemplary steps that may be performed sequentially in fabricating a finned structure usable to form nFET and pFET devices, it being appreciated that additional steps may be necessary or desirable depending on the desired features of the structure. Fabrication may commence with a partially completed structure, in which case one or more of the steps described below could be omitted.

Figure 1:
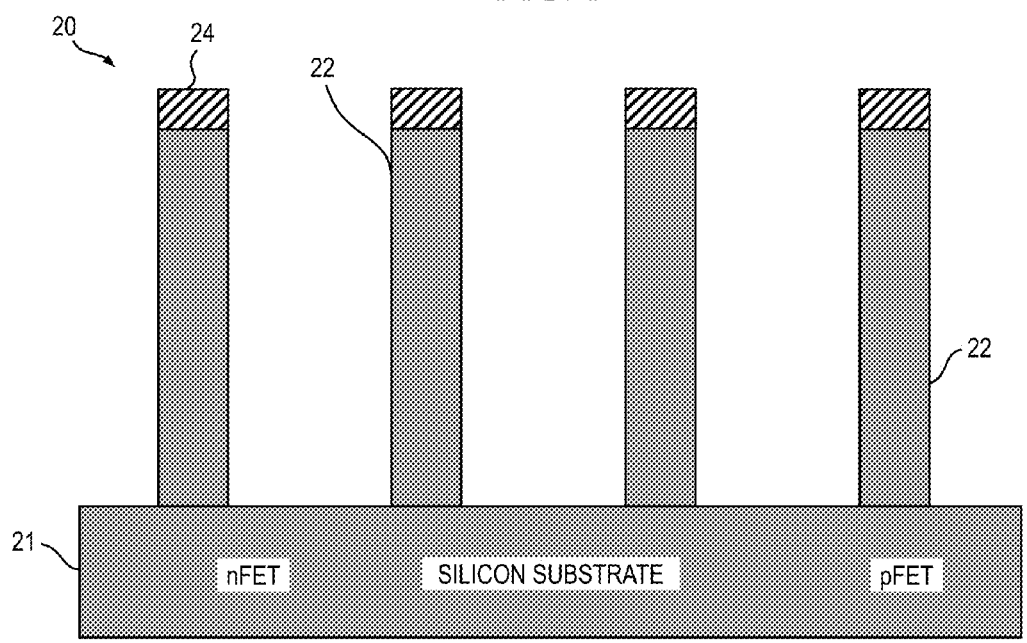
FIG. 1 is a schematic illustration of a bulk silicon substrate including an array of parallel fins and a hard mask on the fins.

A structure 20 including a bulk semiconductor substrate 21 comprised of crystalline silicon is shown in FIG. 1. The substrate may be in the form of a wafer that is essentially undoped. An array of parallel fins 22 is formed from the substrate with a silicon nitride ($Si_3N_4$) hard mask 24. Such a mask 24 may be deposited on the substrate using conventional deposition techniques such as spin-on coating, CVD, plasma-assisted CVD, or other known techniques. The fins 22 extend vertically with respect to the substrate and portions of the hard mask 24 remain atop the fins. The region of the substrate designated nFET is intended for the later formation of nFET devices while the region designated FET is intended for pFET devices. As known in the art, nFET devices are characterized by n+ source/drain regions while pFET devices have p+ source/drain regions. While the fins 22 are shown as having vertical side walls and horizontal top surfaces in the schematic illustrations, it will be appreciated that fins in FinFET structures may have somewhat different configurations such as triangular configurations wherein the fin bases are wider than the tops of the fins. For example, tapered fins formed on bulk silicon substrates facilitate filling the cavities between fins with oxide materials without forming voids. The structure 20 may accordingly include fins having sides that are not completely vertical. Fin heights are preferably equal. Fin heights, widths and spacing are further chosen in accordance with manufacturer preferences. Fin heights in some embodiments range between 10-50 nm. The substrate in one exemplary embodiment is a (100) substrate oriented such that the side walls of the monocrystalline silicon fins 22 are (110) surfaces. As discussed above, the side walls of the fins 22 may not be exactly vertical. Surfaces described as (110) surfaces herein are at least close to being (110) surfaces but may or may not be exactly (110) surfaces.

Figure 2:
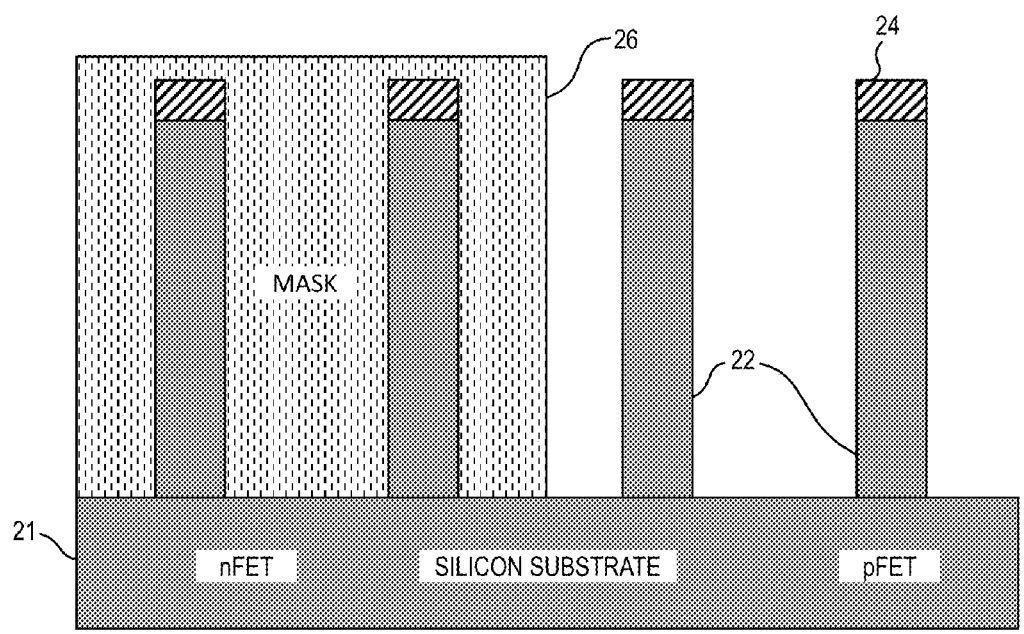
FIG. 2 is a schematic illustration showing the formation of a mask over the nFET region of the structure shown in FIG. 1.

Referring to FIG. 2, a further mask 26 is formed on the structure 20. The mask is an oxide mask such as silicon dioxide in one or more embodiments. The mask can be deposited by chemical vapor deposition (CVD) or other suitable process. As shown in the figure, the mask covers the exposed portions of the substrate and the fins 22 in the nFET region following deposition and patterning.

Figure 3:
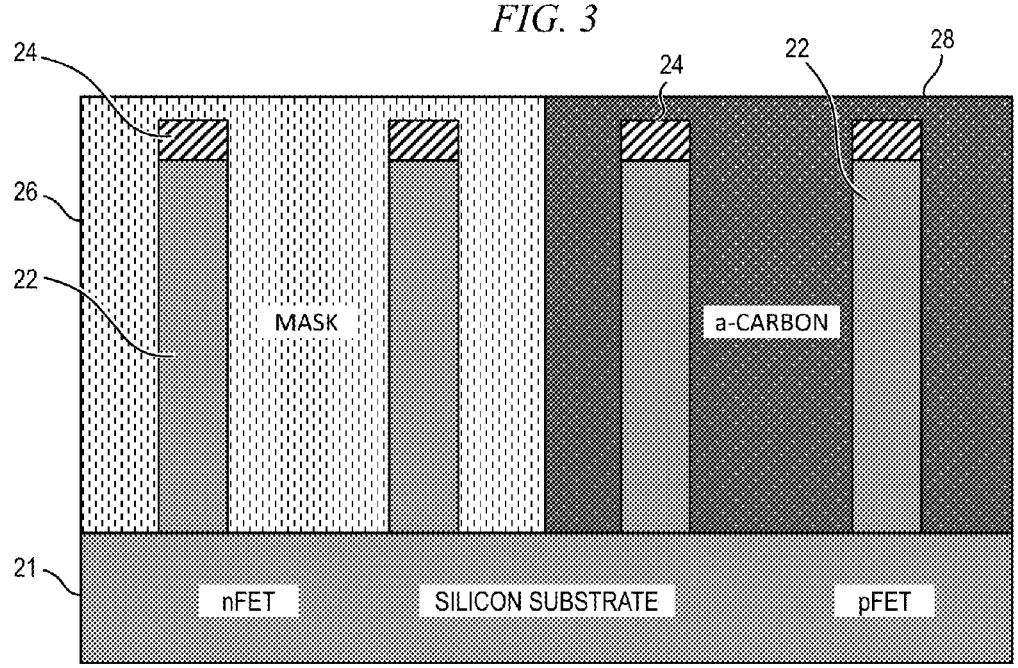
FIG. 3 is a schematic illustration showing the deposition a mask layer the pFET region of structure of FIG. 2.

Referring to FIG. 3, a third mask 28 is deposited over the structure so that the areas between the fins are filled in the region of the structure intended for forming pFET devices. An amorphous carbon (a-carbon) fill is employed in one or more embodiments. Such a mask may be deposited using conventional deposition techniques such as chemical vapor deposition or plasma enhanced chemical vapor deposition (PECVD).

Figure 4:
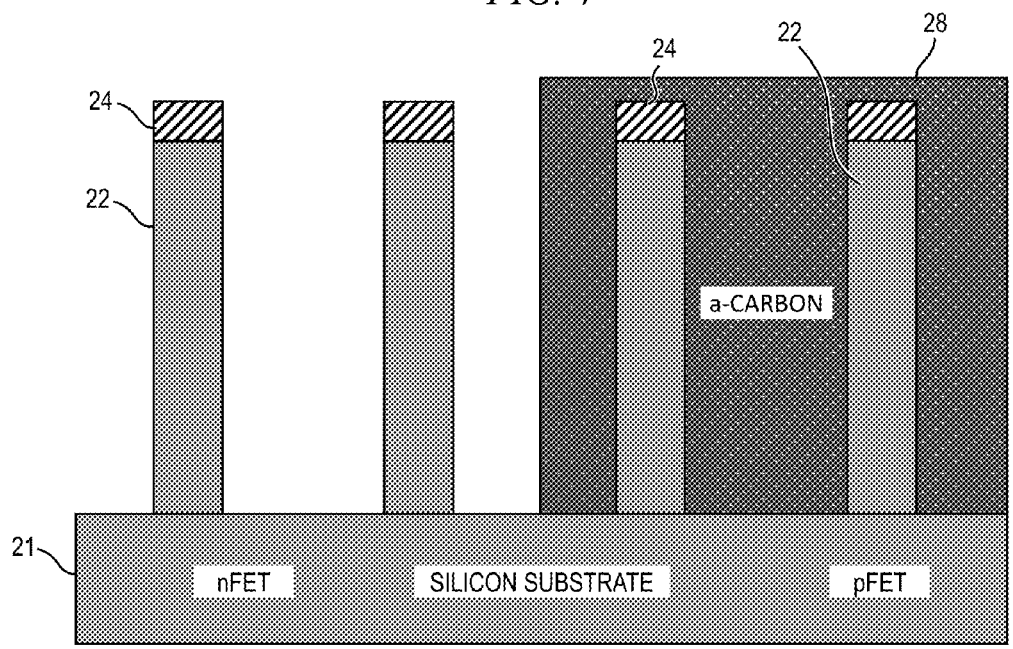
FIG. 4 is a schematic illustration showing removal of the mask from the nFET region.
Figure 5:
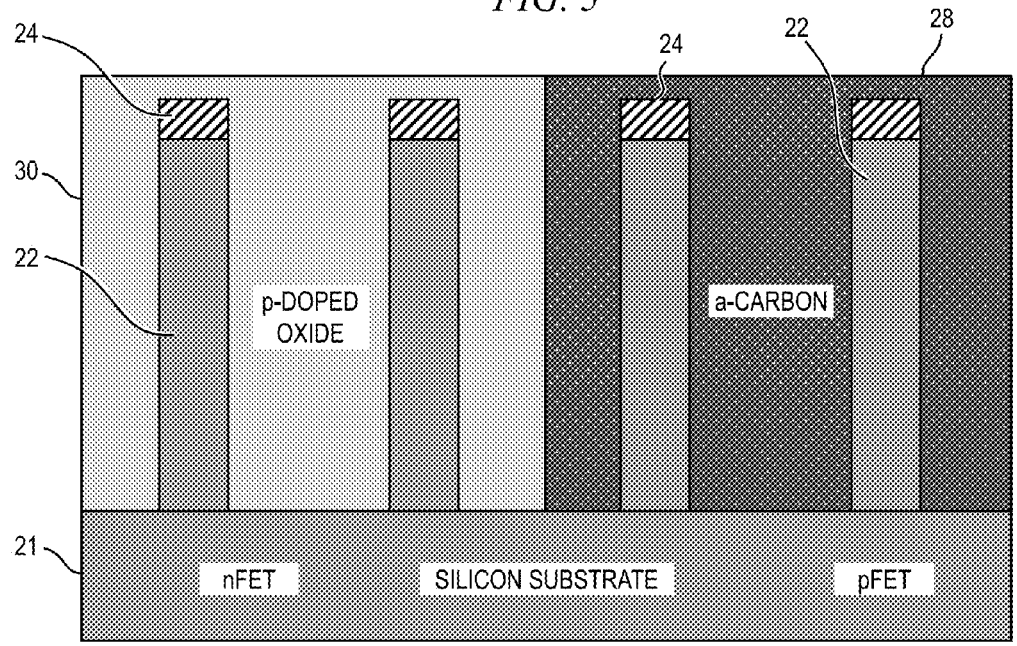
FIG. 5 is a schematic illustration showing the deposition of a p-doped oxide material on the nFET region of the structure of FIG. 4.
Figure 6:
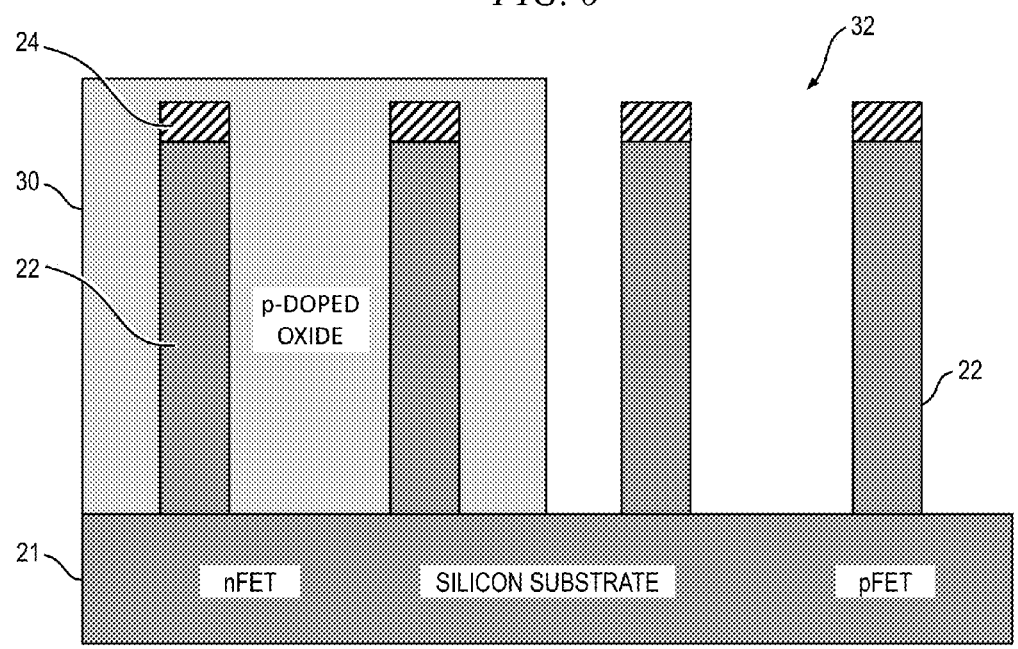
FIG. 6 is a schematic illustration showing removal of the mask from the pFET region of the structure.

Referring to FIG. 4, the oxide mask 26 is removed from the nFET region of the substrate. A buffered hydrogen fluoride (HF) solution can be employed to selectively remove a silicon dioxide mask from the silicon substrate and fins while the pFET region is protected by the amorphous carbon mask. A p-doped silicon dioxide material 30 such as borosilicate glass (BSG) is deposited on the resulting structure and fills the areas between fins 22 in the nFET region, as shown in FIG. 5. Doped spun-on glass (SOG) is employed in some exemplary embodiments. Doped SOG containing boron, phosphorus, or arsenic is commercially available. Atmospheric pressure chemical vapor deposition (APCVD), low pressure chemical vapor deposition (LPCVD, and PECVD are other known techniques for depositing doped and undoped silicon dioxide materials on silicon substrates from applicable precursor materials. The amorphous carbon mask 28 is then removed using a conventional low temperature ashing process. A structure 32 as schematically illustrated in FIG. 6 is accordingly obtained. There is essentially no diffusion of dopant into the fins 22 in the nFET region during removal of the amorphous carbon mask.

Figure 7:
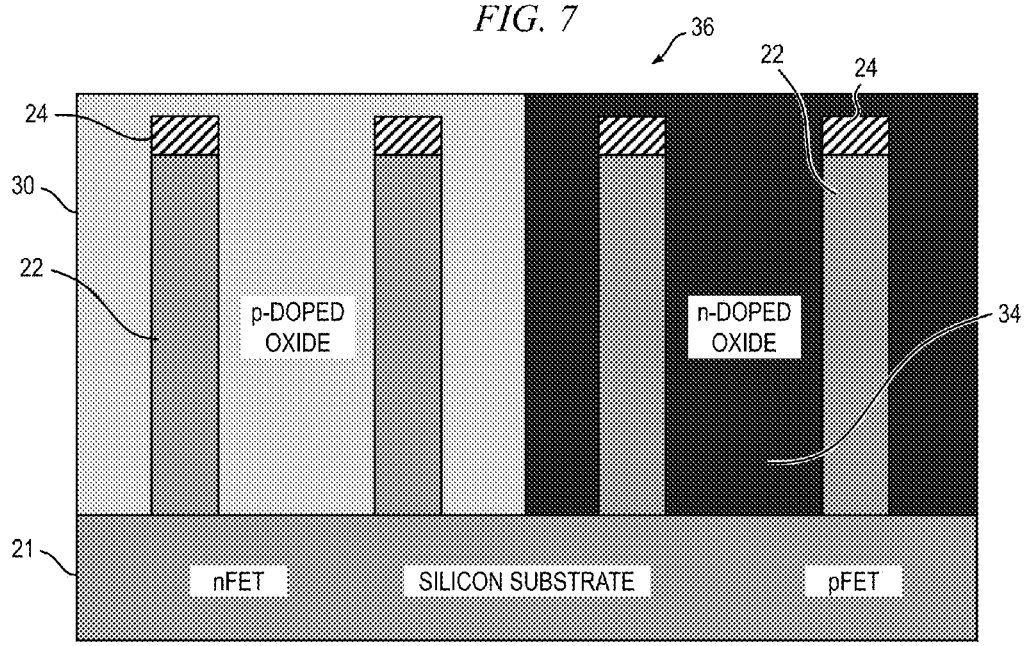
FIG. 7 is a schematic illustration showing deposition of n-doped oxide material on the pFET region of the structure of FIG. 6.
Figure 8:
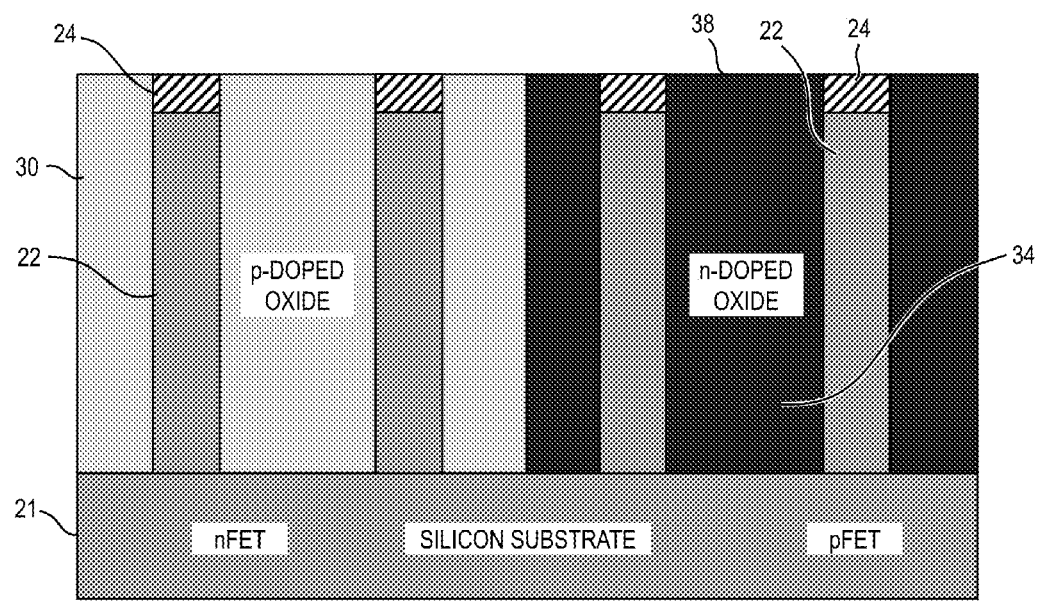
FIG. 8 is a schematic illustration showing the structure of FIG. 7 following chemical mechanical polishing.

Referring to FIG. 7, the pFET region of the structure 32 is filled with n-doped oxide material 34 such as phosphorus or arsenic doped silicon dioxide. Phosphosilicate glass (PSG) and arsenosilicate glass (ASG) are exemplary n-doped oxide materials that are employed in one or more embodiments. The resulting structure 36 includes the p-doped oxide material 30 covering the substrate and fins in the nFET region and the n-doped oxide material 34 covering the substrate and fins in the pFET region. Chemical mechanical polishing (CMP) is employed to remove the oxide materials 30, 34 down to the nitride layer 24. Any n-type oxide material 34 deposited on the p-doped material 30 will be removed in the process. A planar surface 38 is accordingly defined. The heights of the fin/nitride structures are also equal.

Figure 9:
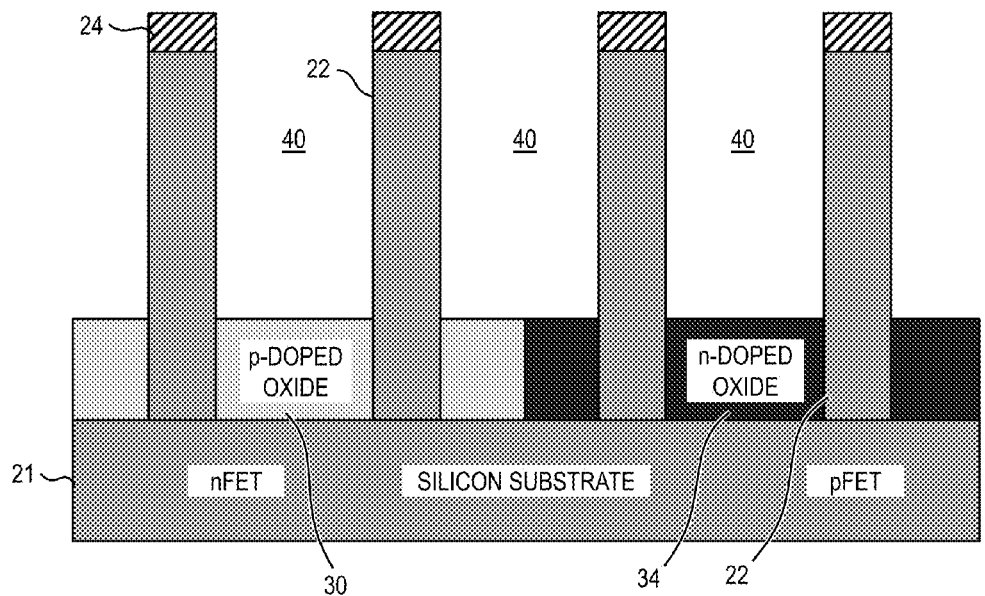
FIG. 9 is a schematic illustration showing the recessing of the doped oxide materials.

A selective etch process is employed to recess the doped oxide materials 30, 34, forming parallel channels 40 between the fins 22. As discussed above, a buffered hydrogen fluoride (HF) solution can be employed to selectively remove silicon dioxide from the areas between silicon fins. Both BSG and PSG etch faster than undoped oxides. Depending on the boron and phosphorus content level in the doped oxide materials 30, 34, the HF concentration can be chosen to provide equal etch rates in both materials. The remaining portions of the oxide layers 30, 34 are substantially equal in thickness in some embodiments, as shown in FIG. 9. The thickness of the doped oxide layers 30, 34 is sufficient to allow the formation of effective punch through stops as described below. In an exemplary embodiment wherein fin heights are one hundred nanometers (100 nm), the doped oxide layers have a thickness between twenty and forty nanometers (20-40 nm). It will be appreciated that there may be circumstances, as discussed further below, where unequal thicknesses of the doped oxide layers 30, 34 are preferred.

Figure 10:
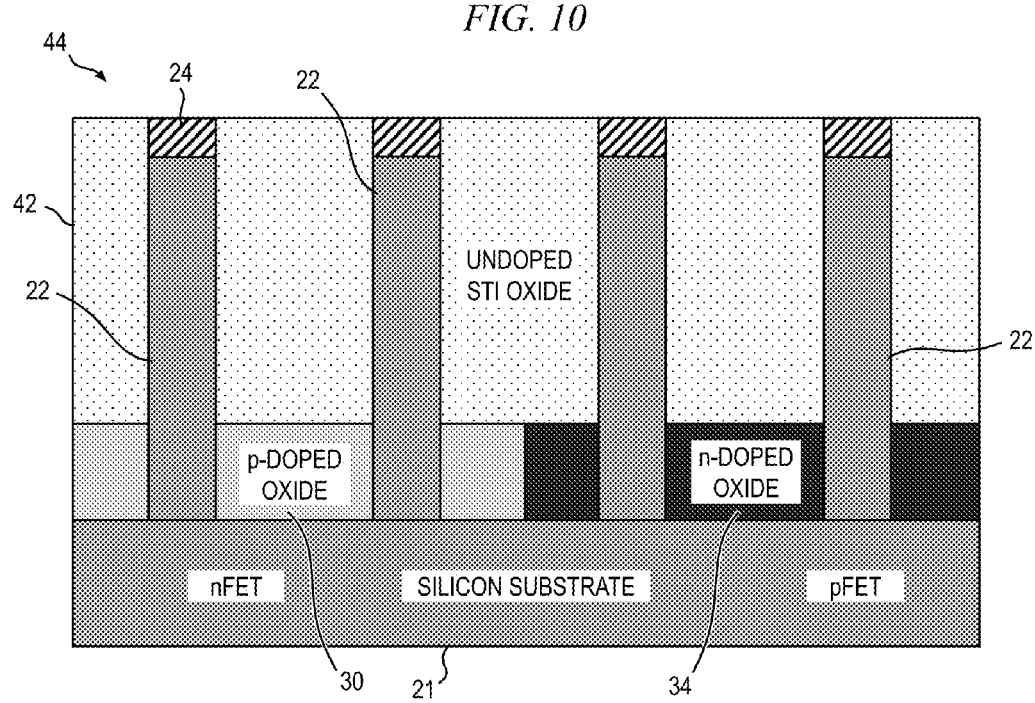
FIG. 10 is a schematic illustration showing the filling of the recesses with an undoped oxide material.

An essentially undoped oxide layer 42 such as silicon dioxide is deposited on the entire structure, filling the channels 40 between the fins 22 and extending above the nitride layer 24. In one or more embodiments, plasma enhanced chemical vapor deposition (PECVD) is used to deposit the undoped oxide layer 42. Following CMP to the top of the nitride layer 24, the structure 44 shown in FIG. 10 is obtained. The structure 44 is annealed to drive dopants from the doped oxide layers 30, 34 into the base portions of the fins 22. In one exemplary embodiment, the entire structure is subjected to temperatures in a range of 850-1100° C. in a rapid thermal anneal tool for about ten seconds. As known in the art, the dopants will be driven deeper and can have a more gradual concentration gradient using relatively long anneal times or high annealing temperatures. Punch through stop regions 46, 48 are thereby formed in the nFET and pFET regions. Dopants are also driven into the surface region of the base portion of the substrate 21, from which the semiconductor fins 22 extend. The diffusion of dopants as described above allows the formation of punch through stop regions for a wide range of FinFET structures, including sub-20 nm nodes. As diffusion has no material effects on lattice, strained silicon or silicon germanium fins do not relax, as is the case using ion implantation. The exemplary method is also advantageous over ion implantation in embodiments where relatively tall gates structures (for example, 100-150 nm above the fins) are employed as potential shadowing problems inherent to ion implantation are avoided. Moreover, tall fins require deeper implants, causing further relaxation of the crystal structure. The undoped oxide layer 42 protects the semiconductor fins 22 during the annealing process.

Figure 11:
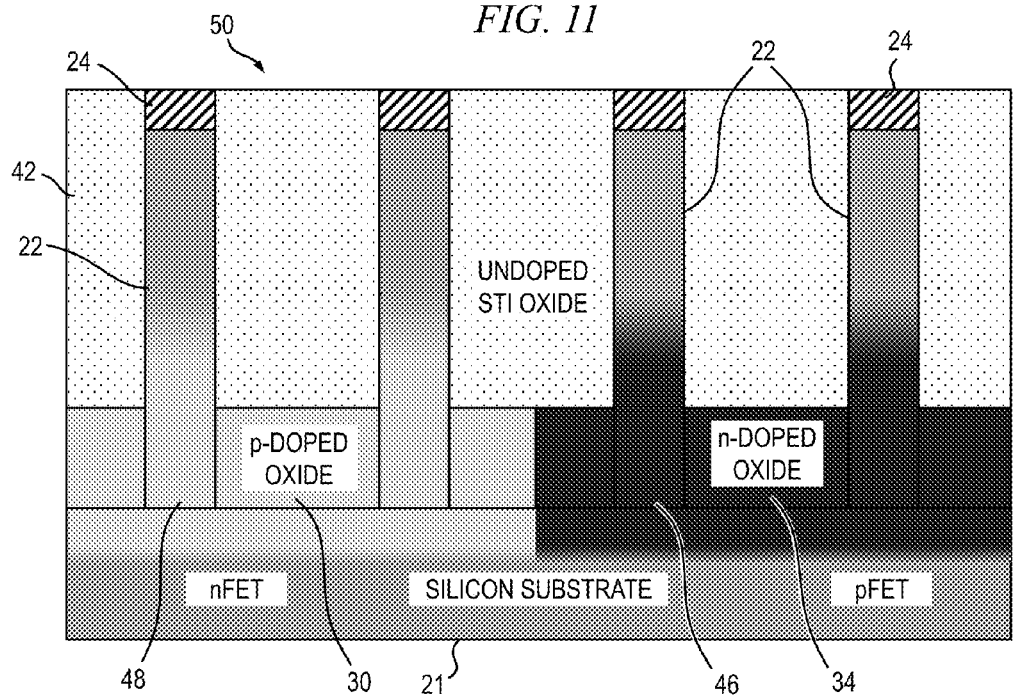
FIG. 11 is a schematic illustration showing the annealing of the structure to drive dopants into the base portions of the fins.
Figure 12:
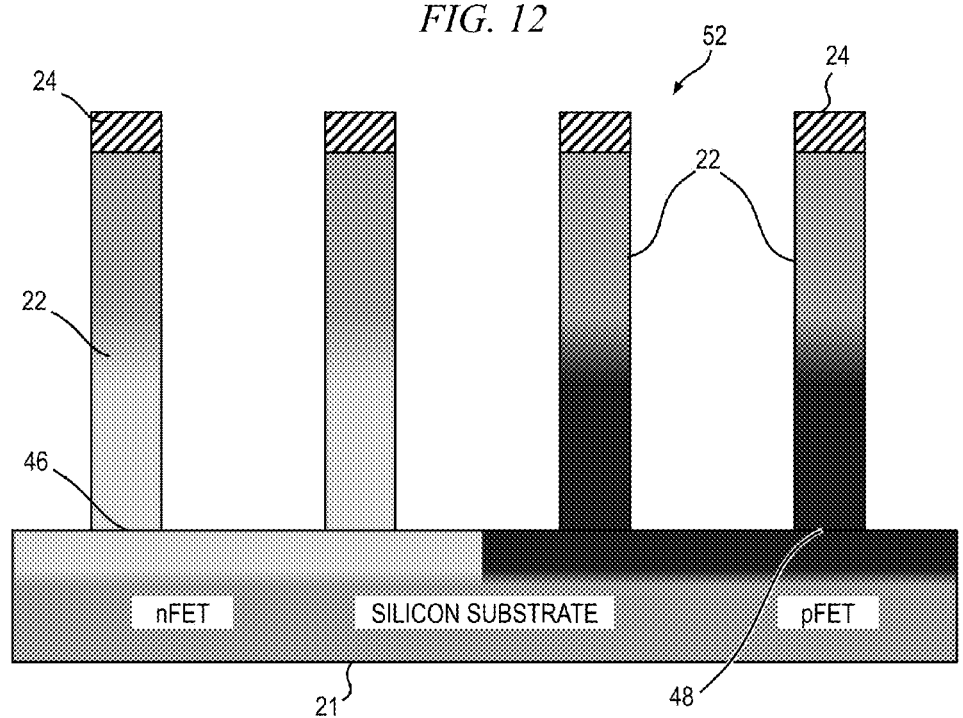
FIG. 12 is a schematic illustration that shows the annealed structure following removal of the oxide materials between the fins.
Figure 13:
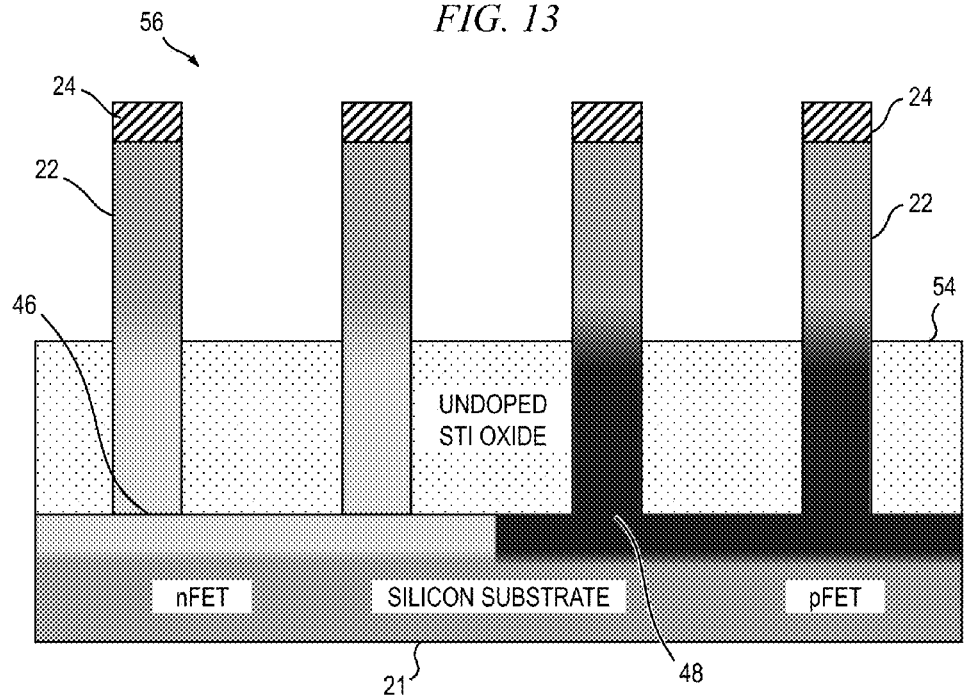
FIG. 13 is a schematic illustration that shows the deposition of an undoped oxide layer between the fins.

Once the structure 50 shown in FIG. 11 is obtained, the oxide materials forming the doped and undoped oxide layers are removed in their entireties in a first exemplary embodiment shown in FIGS. 12-13. A buffered hydrogen fluoride (HF) solution can be employed to selectively remove the oxide layers, leaving the silicon substrate and fins 22 intact. A structure 52 as shown in FIG. 12 is accordingly obtained. The channels 40 between the fins are refilled with an undoped oxide layer 54 such as silicon dioxide. The undoped oxide layer 54 is recessed as necessary to a desired thickness, which corresponds to the thickness of the doped punch through stop regions 46, 48 in the fins 22 in some embodiments. A controlled etch-back process can be employed to recess the oxide layer 54 to the desired thickness. FIG. 13 schematically illustrates a first exemplary structure 56 obtained following deposition of the oxide layer 54, etch-back, and chemical mechanical polishing.

In a second exemplary embodiment, the oxide materials are not entirely removed from the channels 40 between the fins once the structure 50 shown in FIG. 11 is obtained. The undoped oxide layer 42 deposited on the layers of doped oxide material 30, 34 is recessed to form a structure 60 as illustrated schematically in FIG. 14 using a controlled etch-back process. A timed etch using a buffered hydrogen fluoride (HF) solution can be employed to selectively remove silicon dioxide from the areas between the fins 22. The combined thickness of the layers of doped oxide materials 30, 34 and the residual undoped oxide layer 42 corresponds to the thickness of the doped regions 46, 48 of the silicon fins 22 in some embodiments.

Figure 14:
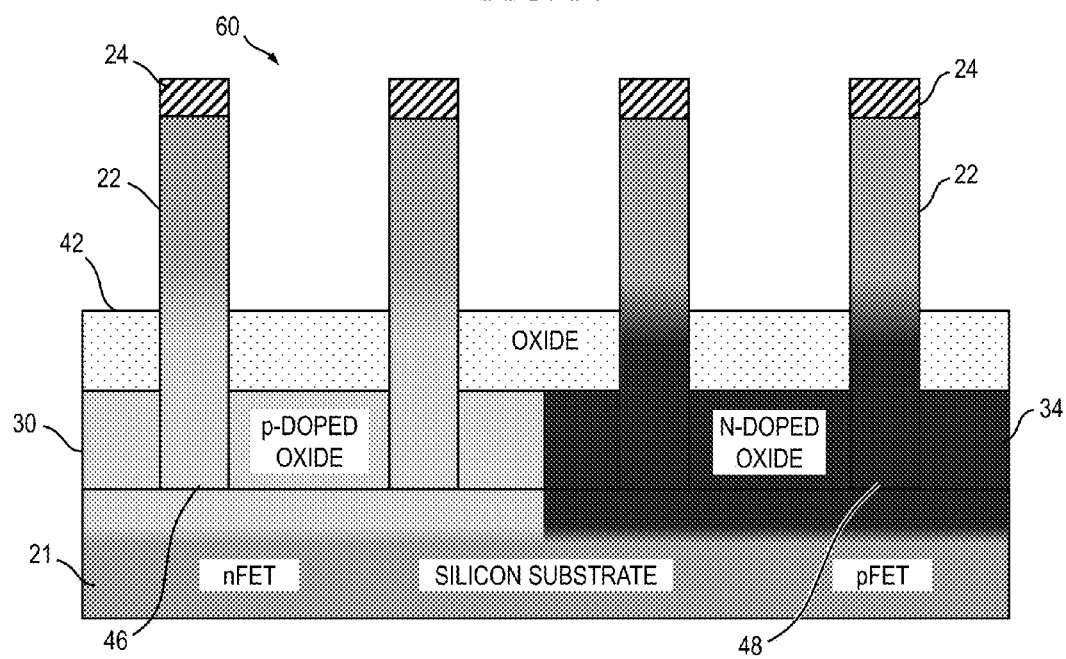
FIG. 14 is a schematic illustration that shows a structure obtained following recessing of the undoped oxide layer shown in FIG. 11

Once the either the structure 56 of FIG. 13 or the structure 60 of FIG. 14 has been obtained, conventional processes may be followed in the fabrication of nFET and pFET devices. The hard mask 24 is removed from the fins 22 using, for example, hot phosphoric acid if the hard mask is a nitride mask. Technology for forming pFET and nFET devices on finned structures is known and also continues to be developed. The gates of FinFETs can be formed using a "gate-first" process wherein a gate stack and spacers are formed prior to selective epitaxial growth on the fins wherein source and drain regions are enlarged. A "gate-last" process may alternatively be employed. Gate-last procedures can involve making a dummy gate, fabricating other elements of the transistor, removing the dummy gate, and replacing the removed dummy gate with actual gate materials.

If a gate-first process as described above is employed, gate materials may comprise a gate dielectric (e.g., high-k such as hafnium oxide) and a gate conductor (e.g., metal gate). Any suitable deposition technique can be used to deposit high-k and metal gate, including but not limited to atomic layer deposition, chemical vapor deposition, physical vapor deposition, sputtering, plating, etc. Gate material can be formed both above and between the fins in some embodiments or, alternatively, only between the fins. Dielectric spacers (not shown) are formed around the gate structure (not shown). If a gate-last process is employed, a dummy gate (not shown) is formed wherein the dummy gate may comprise a dummy gate dielectric (e.g., oxide) covering fins and a dummy gate material (e.g., polysilicon) on top of the dummy gate dielectric. This dummy gate is removed in a later process familiar to those of skill in the art and a replacement metal gate composition is patterned at an appropriate stage of the transistor fabrication process. Fin heights, widths and spacing are further chosen in accordance with manufacturer preferences. Fin heights in some embodiments range between 10-50 nm. In other embodiments, fin heights are at least fifty nanometers.

Once gate structures have been formed on the finned structure, source/drain regions (not shown) are formed on the fins by diffusion, implantation or other techniques familiar to those of skill in the art. In some embodiments, a layer (not shown) of doped material (for example, silicon germanium) may be grown epitaxially or otherwise deposited on the structure, causing the source/drain regions to be merged in some embodiments or form diamond-shaped, unmerged structures in other embodiments. In the fabrication of a pFET structure, boron-doped SiGe can be employed in one or more embodiments for the epitaxial growth of volumes (not shown) on the sidewalls of the fins 22. To fabricate nFET structures, source/drain structures are formed with phosphorus-doped silicon (Si:P) in some embodiments. The doping can be chosen as desired for particular transistor applications. In one exemplary embodiment where the doped source/drain semiconductor material is SiGe, the dopant is boron in a concentration ranging 4-7e20 and the resulting FinFET structure is p-type. Further fabrication steps are performed, some of which depend on the particular FinFET structure to be obtained. Typically the grid comprising the parallel fins and gate structures is filled with a low k dielectric material. Depending on the type of gate processing employed (gate-first or gate-last), appropriate steps are also taken to complete gate fabrication. It will be appreciated that one or more of the fabrication steps may include other intermediary steps such as etching and masking.

Figure 15:
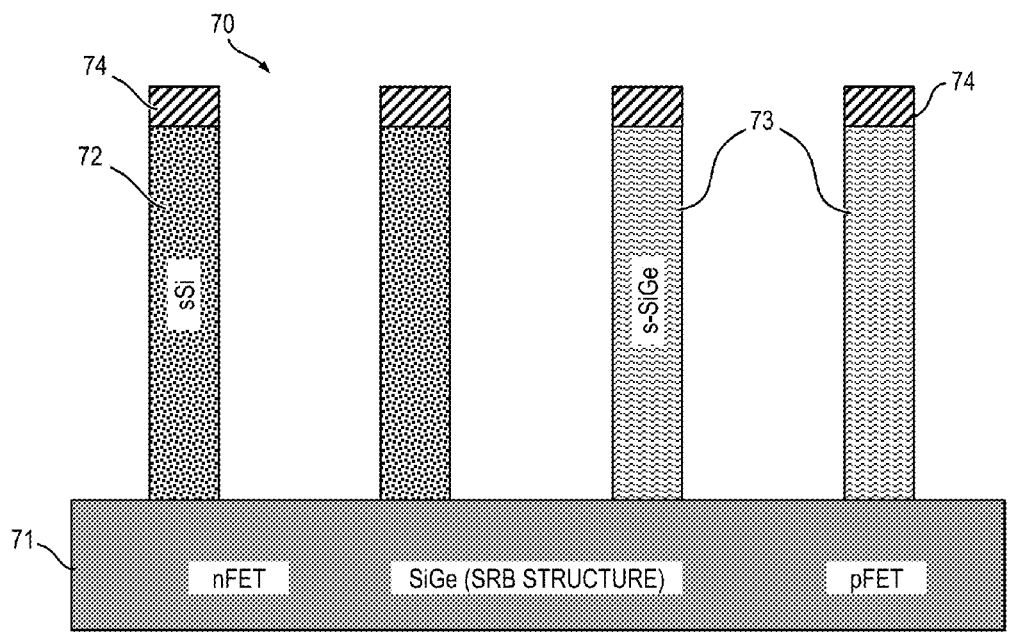
FIG. 15 is a schematic illustration that shows a hybrid structure including arrays of parallel silicon and silicon germanium fins.

The principles discussed above are applicable to hybrid channel structures such as the structure 70 schematically illustrated in FIG. 15. The exemplary structure 70 includes a silicon germanium strain relaxed buffer (SRB) layer 71 on which strained silicon fins 72 and strained silicon germanium fins 73 are formed. In some embodiments, III-V fins are formed on the buffer layer 71. Silicon germanium and III-V semiconductors have higher carrier mobility and are preferred for some applications. A nitride hard mask 74 layer adjoins the top of each fin. The fabrication of hybrid channel structures such as shown in FIG. 15 is known in the art and does not require discussion. Referring again to FIG. 15, the buffer layer in an exemplary embodiment contains 30% germanium, though the mole fractions of silicon and germanium can be different in other embodiments. The silicon germanium fins 73 in one exemplary embodiment are fifty percent (50%) germanium. Higher or lower mole fractions can be employed in other embodiments.

Figure 16:
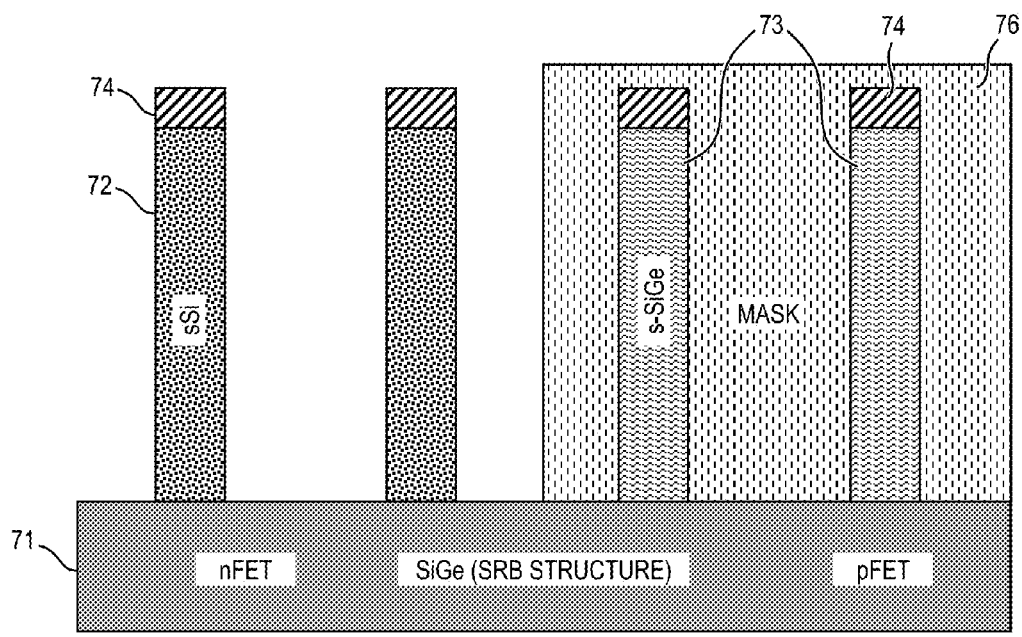
FIG. 16 is a schematic illustration that shows the structure of FIG. 15 including a mask formed in the pFET region.
Figure 17:
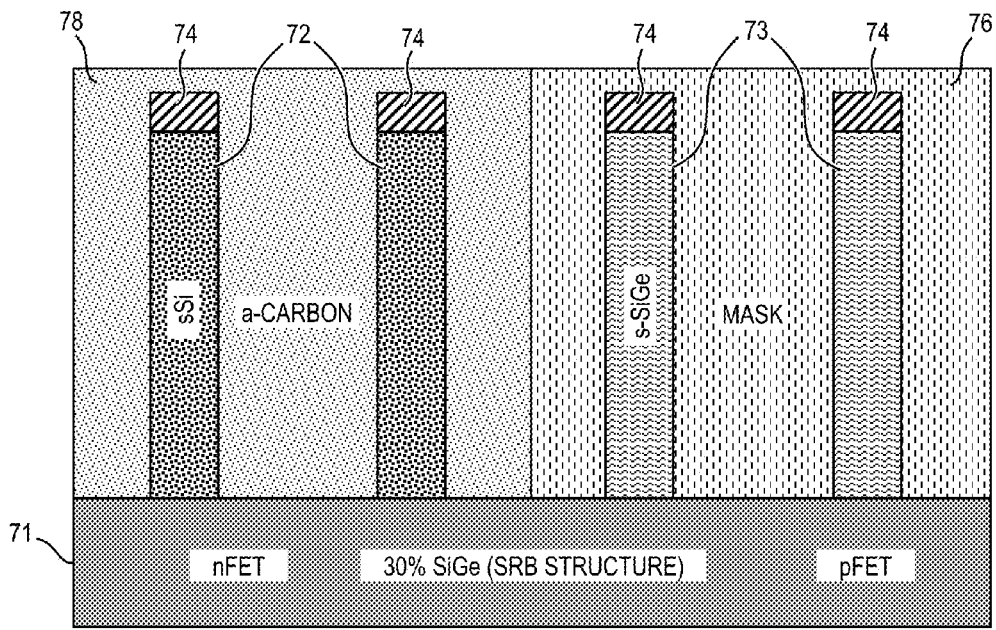
FIG. 17 is a schematic illustration that shows a mask deposited over the nFET region of the structure of FIG. 16.
Figure 18:
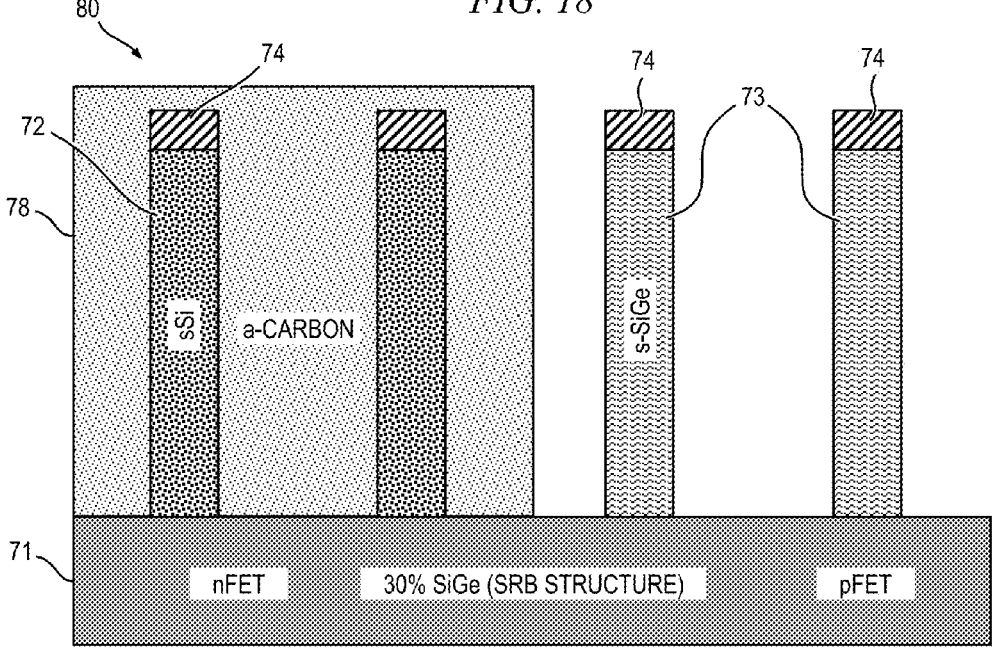
FIG. 18 is a schematic illustration that shows the removal of the mask from the pFET region of the structure.

A layer of oxide material such as silicon dioxide is formed on the structure 70 and patterned to provide a mask 76 on the pFET region shown in FIG. 16. The nFET region is then covered by a second mask 78 as shown in FIG. 17. Amorphous carbon is employed to form the second mask in an exemplary embodiment. The mask materials fill the channels between fins and cover the fins and the nitride layers thereon. The mask 76 in the pFET region is then removed to form the structure 80 schematically illustrated in FIG. 18.

Figure 19:
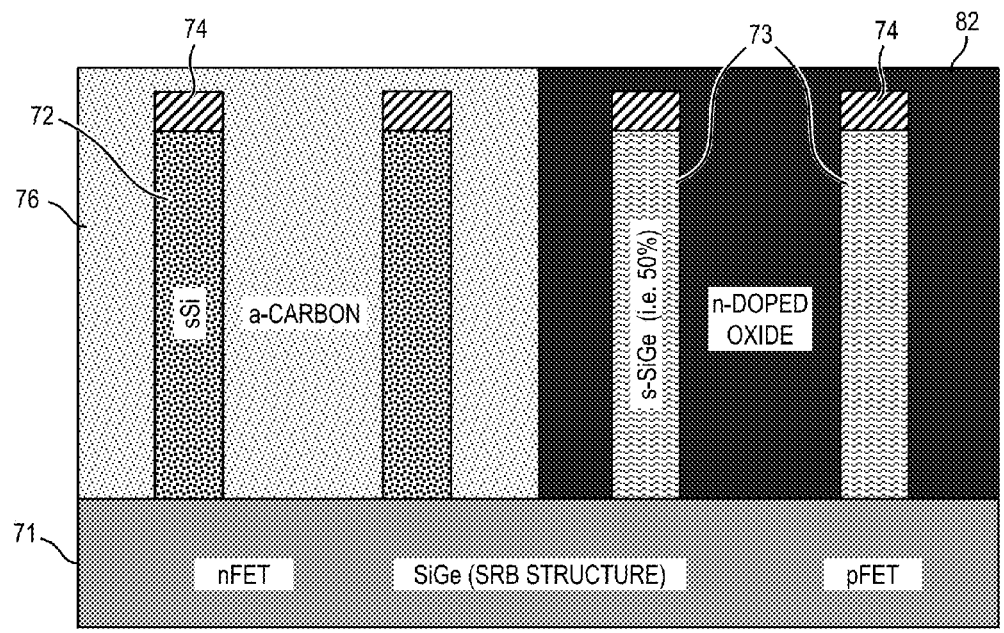
FIG. 19 is a schematic illustration that shows the filling of the pFET region of the structure with an n-doped oxide material.
Figure 20:
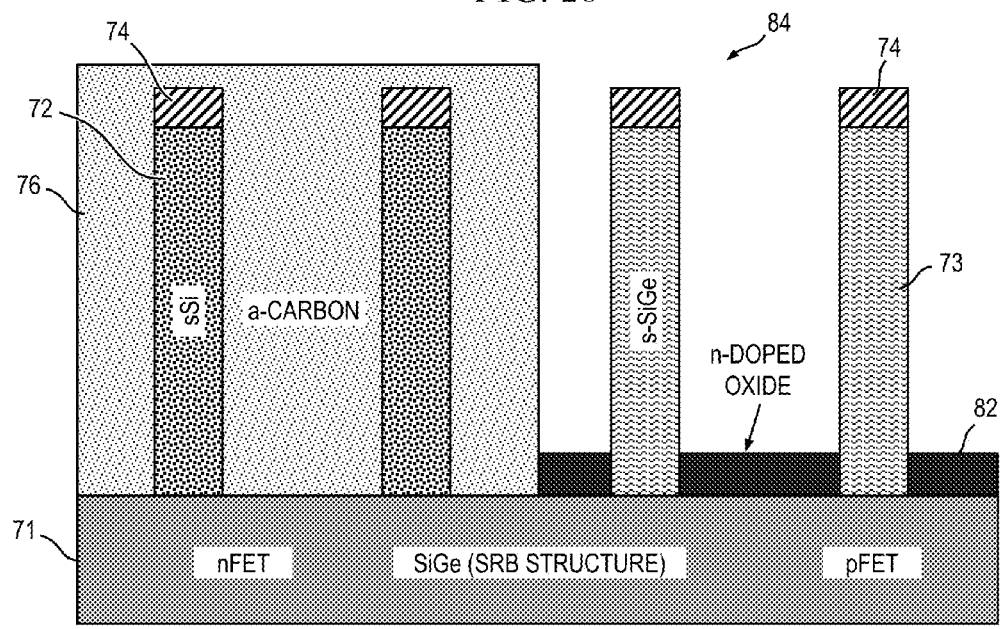
FIG. 20 is a schematic illustration that shows the recessing of the n-doped oxide material.
Figure 21:
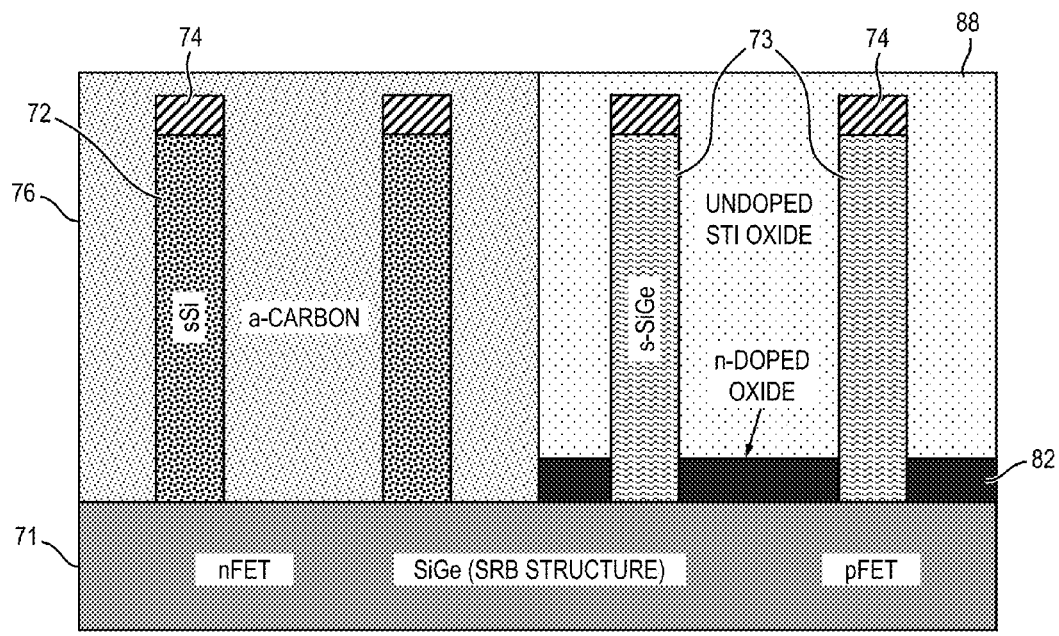
FIG. 21 is a schematic illustration that shows the filling of the areas between fins in the pFET region with an undoped oxide material.
Figure 22:
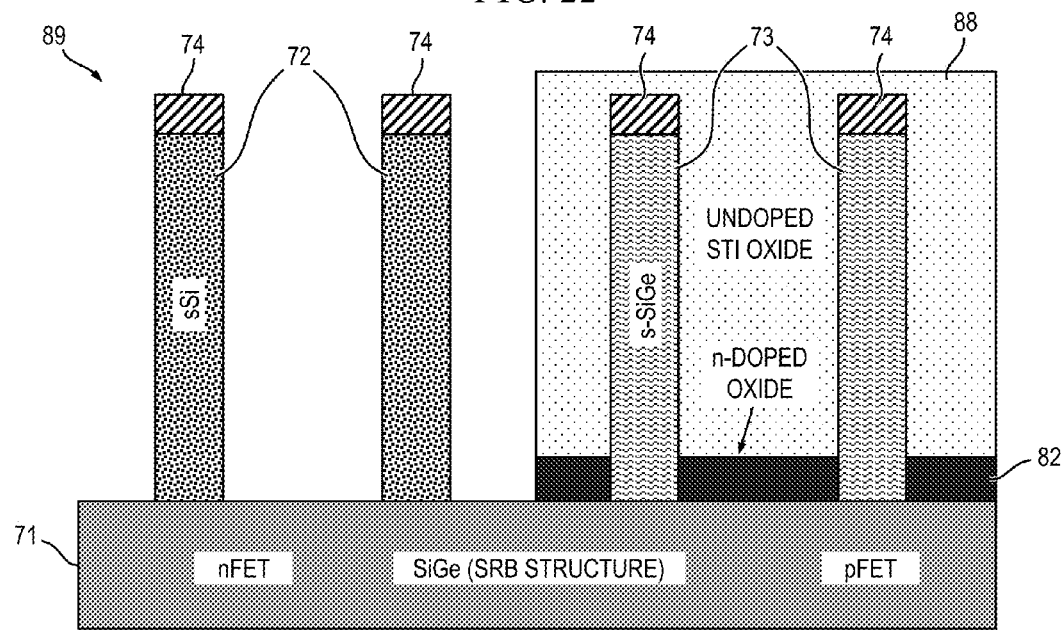
FIG. 22 is a schematic illustration that shows the removal of the mask from the nFET region of the structure of FIG. 21.
Figure 23:
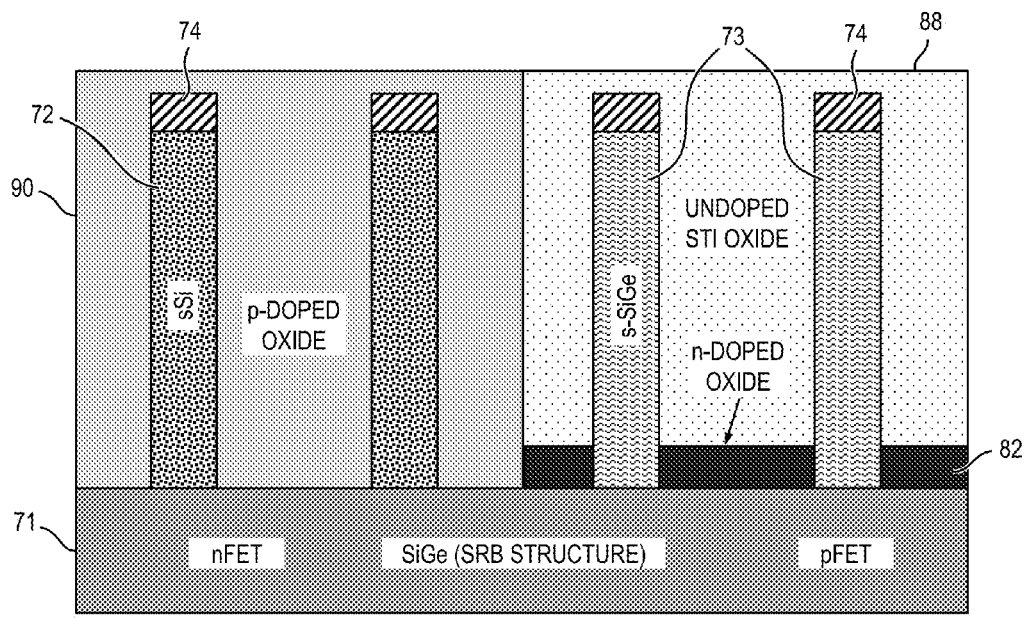
FIG. 23 is a schematic illustration that shows the formation of a p-doped oxide layer on the nFET region of the structure of FIG. 22.

An n-doped oxide layer 82 is deposited on the pFET region of the structure 80, as shown in FIG. 19. In an exemplary embodiment, the oxide layer 82 is an arsenic doped silicon dioxide layer. The n-doped oxide layer 82 is recessed using a controlled etch-back process. A buffered hydrogen fluoride (HF) solution can be employed for the selective etch of the oxide layer 82. The resulting layer 82 directly contacts the base portions of the silicon germanium fins 73 and the top surface of the buffer layer 71. FIG. 20 schematically illustrates the structure 84 that is obtained. An undoped oxide 88 such as silicon dioxide is deposited on the structure 84, filling the channels between the silicon germanium fins 73. The deposition of silicon dioxide is well known to the art as discussed above and is one of the steps in CMOS fabrication technology known as shallow trench isolation (STI). The amorphous carbon mask 78 is then removed using an ashing process to obtain the structure 89 shown in FIG. 22.

Figure 24:
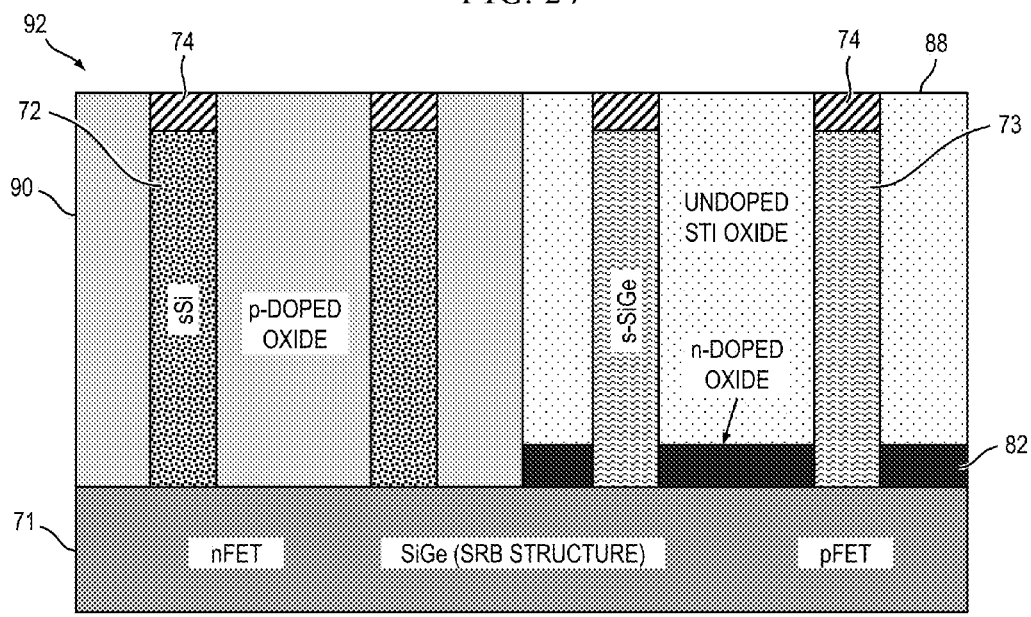
FIG. 24 is a schematic illustration that shows the structure of FIG. 23 following chemical mechanical polishing.

A p-doped oxide layer 90 is deposited on the nFET region of the structure 89. Boron-doped silicon dioxide is deposited to form this layer in one or more embodiments. Chemical mechanical polishing is conducted to planarize the structure and remove p-doped material that may remain on the layer of undoped oxide 88. CMP is discontinued on the nitride hard mask layer 74. The structure 92 schematically illustrated in FIG. 24 is accordingly obtained.

Figure 25:
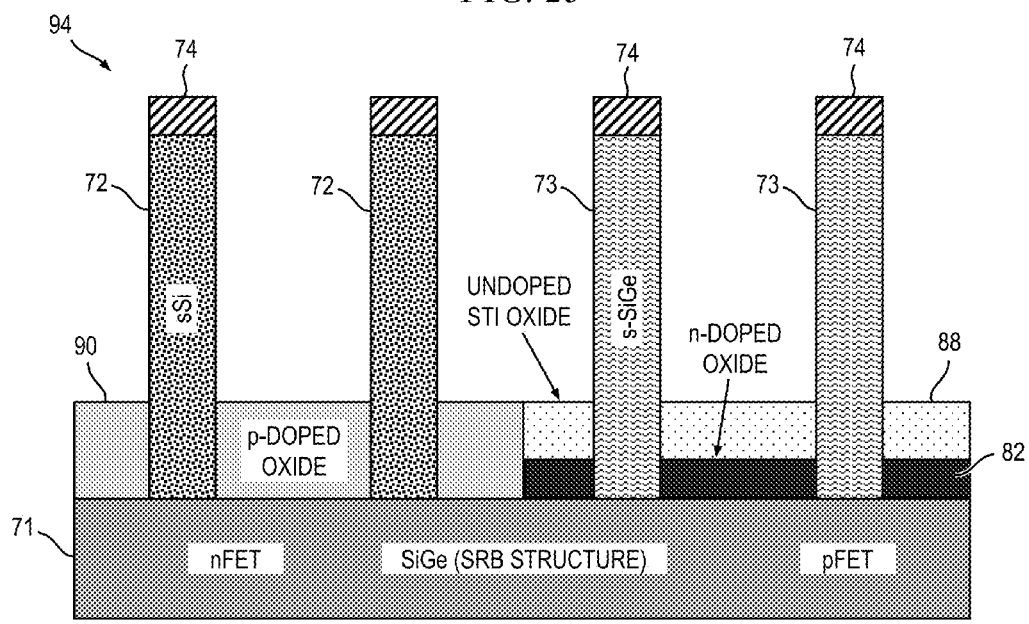
FIG. 25 is a schematic illustration that shows recesses formed in the oxide materials between the fins.
Figure 26:
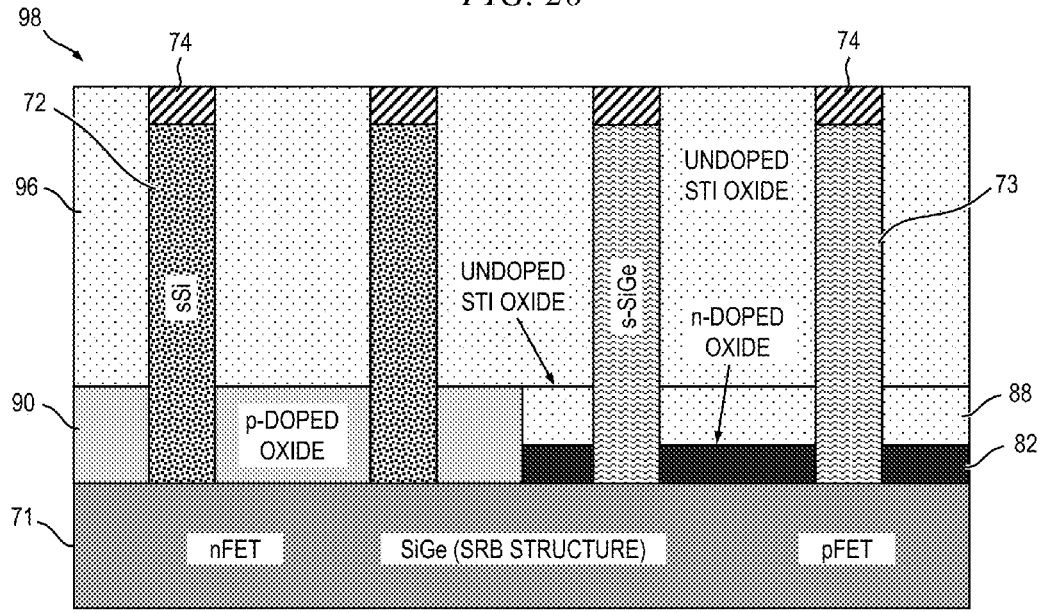
FIG. 26 is a schematic illustration that shows the filling of the areas between fins with an undoped oxide material

The p-doped oxide layer 90 in the nFET region and the undoped oxide layer 88 in the pFET region of the structure 92 are recessed such that the layer of p-doped oxide material is greater in thickness than the layer of n-doped oxide material. The difference in thickness addresses the different diffusion properties of silicon and silicon germanium. In some embodiments, the thickness of the p-doped oxide layer 90 is at least twice the thickness of the n-doped oxide layer 82. FIG. 25 schematically illustrates the structure 94 following the controlled etch-back of the oxide layers 90, 88. An undoped oxide layer 96 such as silicon dioxide is deposited on the structure 94, filling the channels separating the fins 72, 73, followed by CMP down to the nitride layer 74 to remove excess material. The structure 98 shown in FIG. 26 is thereby obtained.

Figure 27:
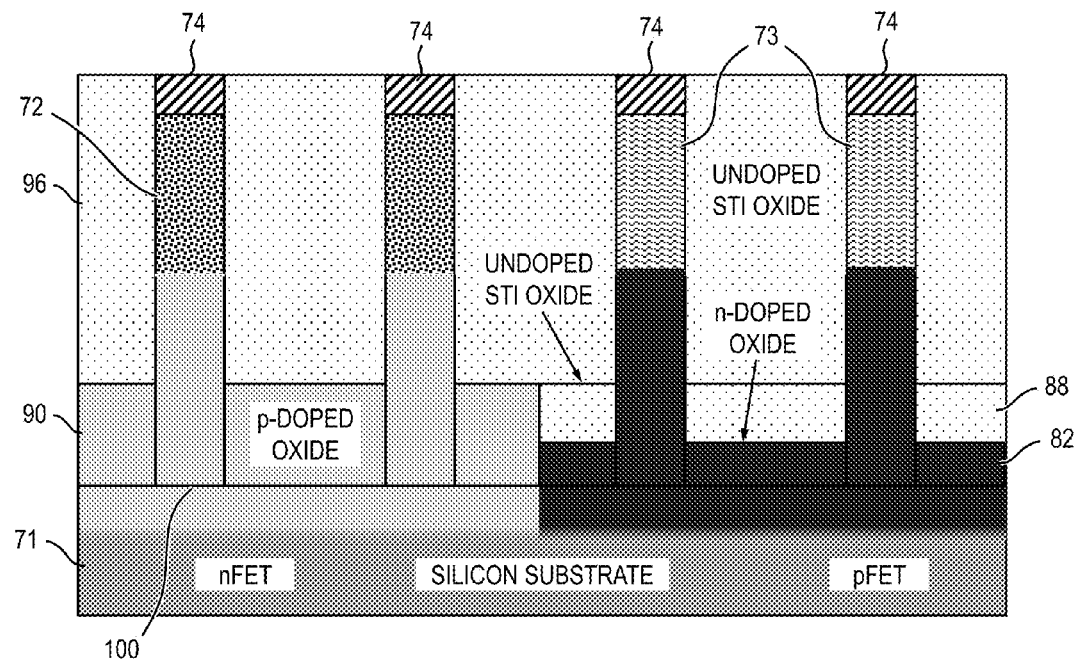
FIG. 27 is a schematic illustration that shows the structure following annealing to drive dopants into the base portions of the fins.
Figure 28:
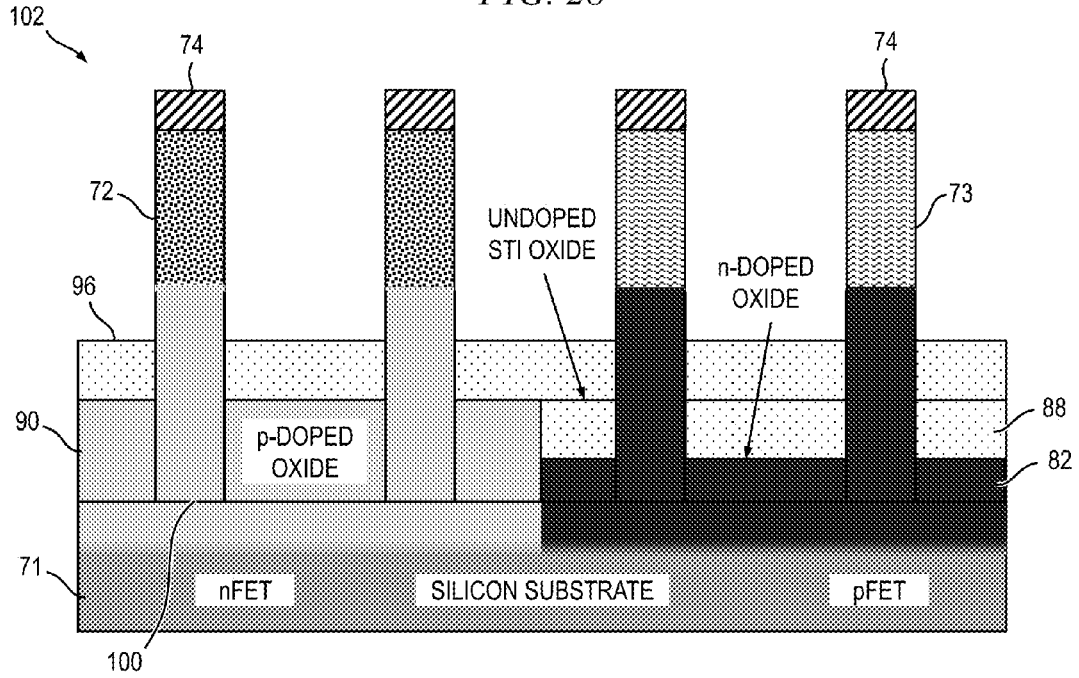
FIG. 28 is a schematic illustration that shows the annealed structure following recessing of the undoped oxide material.

Referring to FIG. 27, the structure 98 is annealed to drive the dopants from the doped oxide layers 82, 90 into the base portions of the fins 73, 72 and the adjoining surface region of the buffer layer 71. The relatively thin layer of n-doped oxide material compensates for the relatively fast rate of diffusion of arsenic into silicon germanium as compared to boron diffusion into silicon. A substantially uniform punch through stop layer 100 is accordingly formed across both the nFET and pFET regions. In other words, the dopants extend to about the same fin heights and about the same depths within the substrate, thereby having substantially similar profiles as shown schematically in FIG. 27, even though diffusion has taken place at different rates. The undoped oxide layer 96 is recessed such that the doped base regions of the fins 73, 72 are about the same height as the overall thickness of the combined doped and undoped oxide layers. The process as described above, by avoiding ion implantation, allows the strained silicon and silicon germanium to remain strained while forming an effective punch through stop layer. Once the structure 102 as shown in FIG. 28 is obtained, conventional processing may be employed to form gate structures and source/drain regions on the arrays of parallel fins 73, 72.

Given the discussion thus far and with reference to the exemplary embodiments discussed above and the drawings, it will be appreciated that, in general terms, an exemplary fabrication method includes obtaining a structure (for example, structure 44 shown in FIG. 10) including a semiconductor substrate 21 (or 71) having an nFET region and a pFET region, a plurality of parallel semiconductor fins 22 (or 72, 73) extending from the substrate, and a plurality of channels 40 separating the semiconductor fins. The structure further includes a p-doped oxide layer partially filling one or more of the channels and directly contacting the nFET region of the substrate and a one or more of the semiconductor fins in the nFET region and an n-doped oxide layer partially filling one or more of the channels and directly contacting the pFET region of the substrate and one or more of the semiconductor fins in the pFET region. An essentially undoped dielectric layer fills the plurality of channels 40 and overlies the p-doped oxide layer and the n-doped oxide layer. The method further includes annealing the structure 44 to form a punch through stop layer 46, 48, the step of annealing the structure causing p-type dopants to be driven from the p-doped oxide layer into one or more of the semiconductor fins 22 (or 72) in the nFET region and into the nFET region of the substrate and n-type dopants to be driven from the n-doped oxide layer into one or more of the semiconductor fins 22 (or 73) in the pFET region and into the pFET region of the substrate. At least part of the essentially undoped dielectric layer is removed following annealing the structure, thereby exposing side walls of the semiconductor fins, as shown in the exemplary structures 52, 60 of FIGS. 12 and 14, respectively. The substrate is a bulk silicon substrate and the fins 22 are cut from the substrate in some embodiments, such as shown in FIGS. 1-14. The structure further includes a hard mask 24 (or 74) on the semiconductor fins in one or more embodiments. The step of obtaining the structure 44 includes, in some embodiments, forming first and second masks 26, 28 on the substrate, the first mask covering the nFET region and the second mask covering the pFET region such as shown in FIG. 4. One of the first and second masks is removed, thereby exposing one of the nFET or pFET regions of the substrate. One of the n-doped oxide layer and the p-doped oxide layer is formed and the other of the first and second masks is removed. A structure 32 as shown in FIG. 6 is obtained. The other of the n-doped oxide layer and the p-doped oxide layer is formed and both doped oxide layers are recessed to obtain a structure as shown schematically in FIG. 9. The essentially undoped dielectric layer is then deposited over the recessed n-doped and p-doped oxide layers. In some embodiments, the method further includes the steps of removing the n-doped oxide layer, the p-doped oxide layer, and the essentially undoped dielectric layers from the channels in their entireties, as shown in FIG. 12, and then depositing an essentially undoped oxide layer 54 within the channels 40. The semiconductor fins may include a first set of fins 72 in the nFET region comprising a first semiconductor material and a second set of fins 73 in the pFET region comprising a second semiconductor material different from the first semiconductor material. In some embodiments, as shown in FIGS. 26 and 27, the thickness of the p-doped layer exceeds the thickness of the n-doped layer. The punch through stop layer 46, 48 (or 100) has a uniform profile in the nFET and pFET regions of the substrate and in the semiconductor fins in the nFET and pFET regions in one or more embodiments. The substrate 71 comprises a silicon germanium strain relaxed buffer layer in some embodiments. In one or more embodiments, the method further includes the steps of forming gate structures on the semiconductor fins and epitaxial source/drain regions on the exposed side walls of the semiconductor fins. The p-doped oxide layer consists essentially of borosilicate glass BSG) and the n-doped oxide layer consists essentially of phosphosilicate glass PSG) or arsenosilicate glass (ASG) in some embodiments.

An exemplary structure provided in accordance with the disclosure includes a semiconductor substrate having a top surface and first and second regions and a plurality of parallel semiconductor fins 22 (or 72, 73) extending from the top surface of the semiconductor substrate, one or more of the semiconductor fins extending from the first region and one or more of the semiconductor fins extending from the second region, the semiconductor fins defining a plurality of channels 40. A p-type punch through stop (PTS) layer 48 is within the first region of the semiconductor substrate and the one or more semiconductor fins extending from the first region. The p-type punch through stop layer includes diffused p-type dopants, not implanted dopants. An n-type punch through stop layer 46 is within the second region of the semiconductor substrate and the one or more semiconductor fins extending from the second region. The n-type punch through stop layer includes diffused n-type dopants. An undoped oxide layer 54 (or 42 or 96) partially fills the channels. In some embodiments such as the structures shown in FIGS. 14 and 28, a p-doped oxide layer partially fills the channels above the first region, the p-doped oxide layer directly contacting the top surface of the semiconductor substrate and the semiconductor fins extending from the first region. An n-doped oxide layer partially fills the channels above the second region, the n-doped oxide layer directly contacting the top surface of the semiconductor substrate and the semiconductor fins extending from the second region. In some embodiments, one or more semiconductor fins 72 are strained silicon fins and the one or more semiconductor fins are strained silicon germanium fins, as shown in FIG. 28. The p-doped oxide layer consists essentially of borosilicate glass and the n-doped oxide layer consists essentially of phosphosilicate glass or arsenosilicate glass in one or more embodiments. The p-doped oxide layer is thicker than the n-doped oxide layer in some embodiments, as schematically illustrated in FIG. 28. The p-type punch through stop layer and the n-type punch through stop layer extend substantially equal distances into the semiconductor fins in some exemplary embodiments such as in the structure 102 shown in FIG. 28.

Those skilled in the art will appreciate that the exemplary structures discussed above can be distributed in raw form (a single wafer having multiple unpackaged chips), as bare dies, in packaged form, or incorporated as parts of intermediate products or end products that benefit from having FinFET devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A semiconductor structure comprising:
 a semiconductor substrate having a top surface and first and second regions;
 a plurality of parallel semiconductor fins extending from the top surface of the semiconductor substrate, one or more of the plurality of parallel semiconductor fins extending from the first region and one or more of the plurality of parallel semiconductor fins extending from the second region, the plurality of parallel semiconductor fins defining a plurality of channels;
 a p-type punch through stop layer within the first region of the semiconductor substrate and the one or more parallel semiconductor fins extending from the first region, the p-type punch through stop layer including diffused p-type dopants;
 an n-type punch through stop layer within the second region of the semiconductor substrate and the one or more parallel semiconductor fins extending from the second region, the n-type punch through stop layer including diffused n-type dopants;
 a p-doped oxide layer partially filling the channels above the first region, the p-doped oxide layer directly contacting the top surface of the semiconductor substrate and the semiconductor fins extending from the first region;
 an n-doped oxide layer partially filling the channels above the second region, the n-doped oxide layer directly contacting the top surface of the semiconductor substrate and the semiconductor fins extending from the second region; and
 an undoped oxide layer partially filling the plurality of channels.

2. The semiconductor structure of claim 1, wherein semiconductor substrate comprises a bulk silicon substrate.

3. The semiconductor structure of claim 1, wherein the p-doped oxide layer consists essentially of borosilicate glass and the n-doped oxide layer consists essentially of phosphosilicate glass or arsenosilicate glass.

4. The structure of claim 3, wherein the one or more parallel semiconductor fins extending from the first region are strained silicon fins and the one or more parallel semiconductor fins extending from the second region are strained silicon germanium fins.

5. The structure of claim 4 wherein the semiconductor substrate comprises a silicon germanium strain relaxed buffer layer.

6. The structure of claim 4, wherein the p-doped oxide layer is thicker than the n-doped oxide layer.

7. The structure of claim 4, wherein the p-type punch through stop layer and the n-type punch through stop layer extend substantially equal distances into the plurality of parallel semiconductor fins.

* * * * *